United States Patent
Nemani et al.

(10) Patent No.: US 8,932,959 B2
(45) Date of Patent: Jan. 13, 2015

(54) METHOD AND SYSTEM FOR ETCHING PLURAL LAYERS ON A WORKPIECE INCLUDING A LOWER LAYER CONTAINING AN ADVANCED MEMORY MATERIAL

(71) Applicant: Applied Materials, Inc., Santa Clara, CA (US)

(72) Inventors: Srinivas D. Nemani, Sunnyvale, CA (US); Mang-mang Ling, San Jose, CA (US); Jeremiah T. Pender, San Jose, CA (US); Kartik Ramaswamy, San Jose, CA (US); Andrew Nguyen, San Jose, CA (US); Sergey G. Belostotskiy, Santa Clara, CA (US); Sumit Agarwal, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/786,850

(22) Filed: Mar. 6, 2013

(65) Prior Publication Data
US 2014/0170856 A1    Jun. 19, 2014

Related U.S. Application Data

(60) Provisional application No. 61/739,310, filed on Dec. 19, 2012.

(51) Int. Cl.
*H01L 21/302* (2006.01)
*H01L 21/461* (2006.01)
*H01L 45/00* (2006.01)
*H01J 37/32* (2006.01)

(52) U.S. Cl.
CPC ............... *H01L 45/00* (2013.01); *H01J 37/321* (2013.01)
USPC ........... 438/706; 438/707; 438/712; 438/719; 438/720; 438/722; 438/723; 438/724

(58) Field of Classification Search
CPC ................ H01L 21/3065; H01L 21/31116; H01L 21/30604; H01L 21/76898; H01L 21/30655; H01L 21/31138; H01L 21/32137; H01L 21/32136; H01L 21/67011; H01L 21/02019; H01L 21/311; H01L 21/31111
See application file for complete search history.

(56) References Cited

U.S. PATENT DOCUMENTS

| | | | |
|---|---|---|---|
| 6,211,092 B1 | 4/2001 | Tang et al. | |
| 8,658,511 B1 * | 2/2014 | Fulgenico et al. | 438/382 |
| 2002/0096259 A1 | 7/2002 | Collins et al. | |
| 2005/0236365 A1 * | 10/2005 | Komatani | 216/67 |
| 2013/0059440 A1 * | 3/2013 | Wang et al. | 438/694 |

FOREIGN PATENT DOCUMENTS

| | | | |
|---|---|---|---|
| KR | 10-2009-0023525 A | 3/2009 | |
| KR | 10-2010-0066994 A | 6/2010 | |
| WO | WO 03/081645 A2 | 10/2003 | |

\* cited by examiner

*Primary Examiner* — Duy Deo
(74) *Attorney, Agent, or Firm* — Robert M. Wallace

(57) ABSTRACT

Etching of a thin film stack including a lower thin film layer containing an advanced memory material is carried out in an inductively coupled plasma reactor having a dielectric RF window without exposing the lower thin film layer, and then the etch process is completed in a toroidal source plasma reactor.

17 Claims, 4 Drawing Sheets

METHOD AND SYSTEM FOR ETCHING PLURAL LAYERS ON A WORKPIECE INCLUDING A LOWER LAYER CONTAINING AN ADVANCED MEMORY MATERIAL

CROSS-REFERENCE TO RELATED APPLICATIONS

This application claims the benefit of U.S. Provisional Application Ser. No. 61/739,310 filed Dec. 19, 2012 entitled A METHOD OF ETCHING PLURAL LAYERS ON A WORKPIECE INCLUDING A LOWER LAYER CONTAINING A METAL, by Srinivas D. Nemani, et al.

BACKGROUND

Plasma etching of thin film layers on a workplace such as a semiconductor wafer can be performed in a plasma reactor having an inductively coupled plasma (TCP) source. Such a reactor may be referred to as an ICP reactor. An advantage of an ICP reactor is its ability to produce very high plasma density for a high etch rate and superior productivity. An ICP reactor typically has an external coil antenna that couples RF plasma source power into the chamber interior through a dielectric window. The materials used in advanced memory technologies for magnetic random access memories (MRAMs) have desirable magnetic properties and include (but are not limited to) Co, Pi, Pd and Ru. Such materials may be referred to as advanced memory materials. These materials tend to accumulate on the dielectric window as a metal film, because they resist combining with etch process gases (or plasma by-products formed from the etch process gas) to form gaseous or volatile species that would be readily removed by evacuation or pumping. Therefore, in this specification, such advanced memory materials are referred to as being "non-volatilizable". Ordinary metals not included in the group of advanced memory materials generally react with a plasma to form either: (a) gaseous or volatile species that are readily removed or (b) compounds that accumulate on the dielectric window as non-metallic materials that do not significantly affect RF coupling through the dielectric window. Unlike ordinary metals, the advanced memory materials (the non-volatilizable metals) do not in general react with a plasma to form compounds, and instead accumulate on the dielectric window as a metal. In many cases, the non-volatilizable metal or material is located in a lower thin film layer, while the overlying thin film layers are ordinary materials not included in the group of advanced memory materials, that are readily removed during an etch process. Such ordinary materials may include non-metallic materials (such as SiN, TiN, polysilicon, or silicon dioxide, for example), or ordinary metals (such as Ta, Ti, or W, as a few examples) which are not advanced memory materials.

The non-volatilizable metal layer is exposed upon removal (etching) of the overlying thin film layers. When the lower layer containing the non-volatilizable metal is uncovered and exposed to the plasma, the non-volatilizable metal is released into the plasma chamber and deposited on interior chamber surfaces, including the dielectric window of the ICP reactor. The non-volatilizable metallic material builds up over time on the dielectric window. The coupling of RF plasma source power through the dielectric window is altered or attenuated by the buildup of metal on the window. The metallic accumulation on the dielectric window can shift RF coupling and plasma density in an uncontrollable manner, therefore causing process drift.

SUMMARY

A method is provided for etching a stack of thin film layers on a workplace including a lower thin film layer of an advanced memory material. The method includes first etching the stack in an inductively coupled plasma reactor without exposing the lower thin film layer, and second etching the stack in a toroidal source plasma reactor to expose the lower thin film layer.

In one embodiment, the stack of thin film layers includes a covering thin film layer overlying the lower thin film layer, the method further including halting the first etching prior to complete removal of the covering thin film layer, so as to leave at least a portion of the covering thin film layer on the lower thin film layer.

In a related embodiment, the second etching includes removing the portion of the covering thin film layer. In a further embodiment, the second etching further includes removing the lower thin film layer.

In one embodiment, the first etching includes supplying etch process gases into the chamber of the inductively coupled reactor and coupling RF power from an external coil antenna into the chamber of the inductively coupled reactor through a dielectric window. In a further embodiment, the second etching includes supplying etch process gases into the chamber of the toroidal source plasma reactor and coupling RF power into an external reentrant conduit of the chamber.

In a related embodiment, the coupling of RF power into an external reentrant conduit of the chamber includes coupling RF power to an inductive core surrounding a portion of the external reentrant conduit.

The advanced memory material is a member of a group including: Co, Pt, Pa, Ru, CoPt, CoFe, CoFeB, MgO, PtMn, CoPd, TbFeCo, Fe, FePt, IrMn, NiFe, NiFeCr, CoFeBTa, CoFeBZr, CoFeMnSi, FePd, Cu, IrMnC, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Fe_3Si$, $Fe_2VA1$, $Mn_2VGa$, $Co_2FeGe$.

In a related embodiment, the thin film layers overlying the lower thin film layer do not contain an advanced memory material.

BRIEF DESCRIPTION OF THE DRAWINGS

So that the manner in which the exemplary embodiments of the present invention are attained can be understood in detail, a more detailed description of the invention, briefly summarized above, may be obtained by reference to the embodiments thereof which are illustrated in the appended drawings. It is to be appreciated that certain well known processes are not discussed herein in order to not obscure the invention.

Figure 1:
FIG. 1 depicts a thin film structure that is processed in accordance with the present invention.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Referring to FIG. 1, a workpiece such as a semiconductor wafer 2 is covered with a stack of thin film layers 4, of which a lower thin film layer 4a is formed of an advanced memory material having desirable magnetic properties for a magnetic random access memory (MRAM). The advanced memory material is non-volatilizable. The advanced memory (or non-volatilizable) material is in a group consisting of the following materials: Co, Pt, Pd, Ru, CoPt, CoFe, CoFeB, MgO, PtMn, CoPd, TbFeCo, Fe, FePt, IrMn, NiFe, NiFeCr, CoFeBTa, CoFeBZr, CoFeMnSi, FePd, Cu, IrMnC. The group further includes the Huesler alloys, as follows: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Fe_3Si$, $Fe_2VAl$, $Mn_2VGa$, $Co_2FeGe$.

Each of the overlying layers 4b through 4f are formed of respective non-metallic materials (such as SiN, TiN, polysilicon or silicon dioxide, for example), and respective metals (such as Ta or W, for example) that are not included in the group of advanced memory materials listed above. While etching the structure of FIG. 1 in an inductively coupled plasma reactor chamber, the layers are removed starting from the top layer 4f and then progressing downward through the stack of layers 4e, 4d, 4c, etc. The layer 4b is the last (bottommost) non-metal layer and covers the layer 4a containing the advanced memory material, and is therefore referred to as the "covering layer" 4b. As soon as the covering layer 4b is removed, the layer 4a containing the advanced memory material is exposed to the plasma and at least some of its metal material is released, (e.g., by sputtering or diffusion) into the reactor chamber. The metal material of the layer 4a is non-volatilizable, in that it tends to adhere to the dielectric window of an TCP reactor as a metal, causing an uncontrollable shift in RF coupling (causing a shift in process parameters such as plasma density and etch rate). Such an uncontrollable shift is a significant problem. Etching of the overlying layers 4b-4e does not lead to such a problem because these layers are either non-metallic or are of a metal that is not a member of the group of advanced memory materials, so that it is readily removed in an etch process (and therefore does not accumulate on the dielectric window).

The problem of an uncontrollable shift in RF coupling is solved by initially etching the wafer 2 in an ICP reactor, so as to remove the layers 4c-4f without completely etching the covering layer 4b (so as to avoid exposing the layer 4a), or without any etching of the covering layer 4b. Then, the wafer 2 is removed from the ICP reactor and placed in a toroidal source plasma reactor, and the etching or removal of the covering layer 4b is completed, exposing the advanced memory material of the lower layer 4a. In one embodiment, this second etching process may be carried out further to remove both of the layers 4a and 4b.

The toroidal source plasma reactor does not rely upon RF coupling through a dielectric window, and therefore it is not as susceptible to metal deposition on interior chamber surfaces as an ICP reactor. The advantage is that nearly all of the layers in the stack may be etched in an ICP reactor at the very high etch rate afforded by an ICP reactor, and only the non-volatilizable metal-containing layer 4a and/or the covering layer 4b need be etched in the toroidal source plasma reactor.

Figure 2:
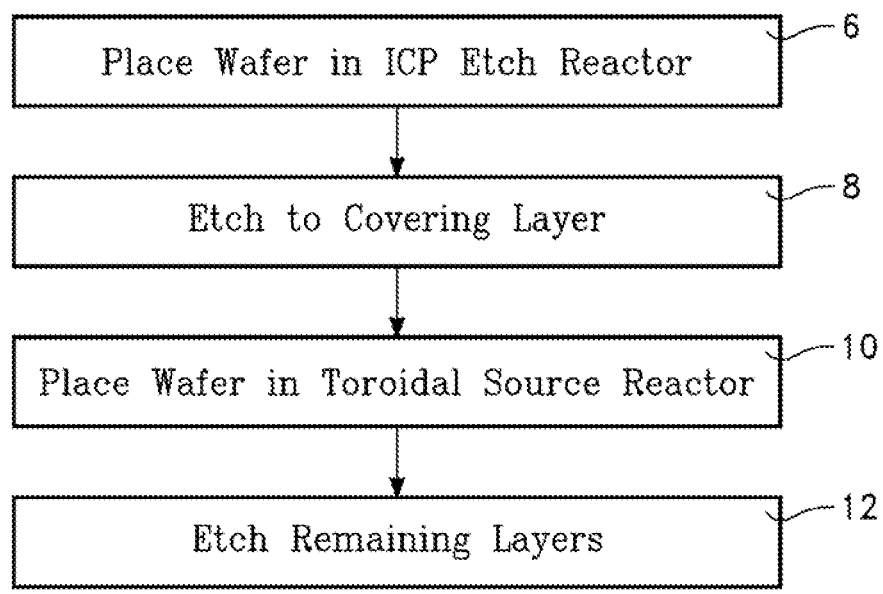
FIG. 2 depicts a process in accordance with one embodiment.

FIG. 2 depicts a method of the invention. The first step is to place the wafer 2 (with its stack of thin films 4a-4f) in an ICP reactor (block 6 of FIG. 2) and carry out an ICP etch process until all but the covering layer 4b (or a portion of the covering layer 4b) have been removed (block 8 of FIG. 2), leaving the advanced memory material-containing layer 4a covered and unexposed to plasma. Then, the wafer 2 is removed from the ICP reactor and placed in a toroidal source plasma reactor (block 10 of FIG. 2). In the toroidal source plasma reactor, an etch process is carried out to remove the covering layer 4b (or the remainder of the covering layer 4b) (block 12 of FIG. 2). If the lower layer 4a containing the advanced memory material is to be removed, then the etch process in the toroidal source reactor is carried out until the lower layer 4a is removed.

Figure 3:
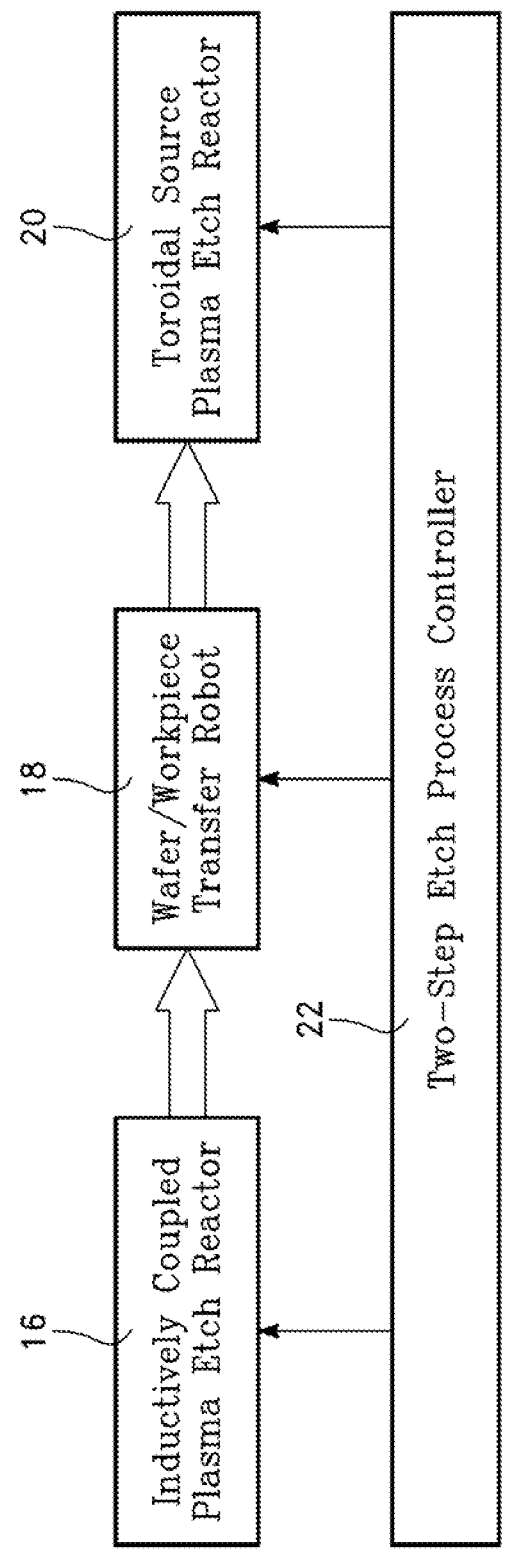
FIG. 3 depicts apparatus for carrying out the process of FIG. 2.

FIG. 3 depicts a system for carrying out the process of FIG. 2. The system includes an ICP reactor 16, a wafer transfer robot 18 and a toroidal source reactor 20. The wafer transfer robot 18 is arranged to transfer successive wafers from the ICP reactor 16 to the toroidal source reactor 20. An etch process controller 22 controls the ICP reactor 16, the wafer transfer robot 18 and the toroidal source plasma reactor 20. The etch process controller 22 is programmed to control the ICP reactor 16, the wafer transfer robot 18 and the toroidal source reactor 20 to carry out the process of FIG. 2. In one embodiment, the etch process controller 22 is programmed to: (a) have a workpiece loaded into the ICP reactor 16 and have the workpiece etched in the ICP reactor 16 without exposing the non-volatile metal-containing layer, then (b) have the wafer transfer robot 18 transfer the workpiece from the ICP reactor 16 to the toroidal source plasma reactor 20, and finally (c) have the workpiece etched in the toroidal source plasma reactor 20 to at least expose the non-volatile metal-containing layer. One embodiment of the ICP reactor 16 is depicted in FIG. 4 and one embodiment of the toroidal source plasma reactor 20 is depicted in FIG. 5.

Figure 4:
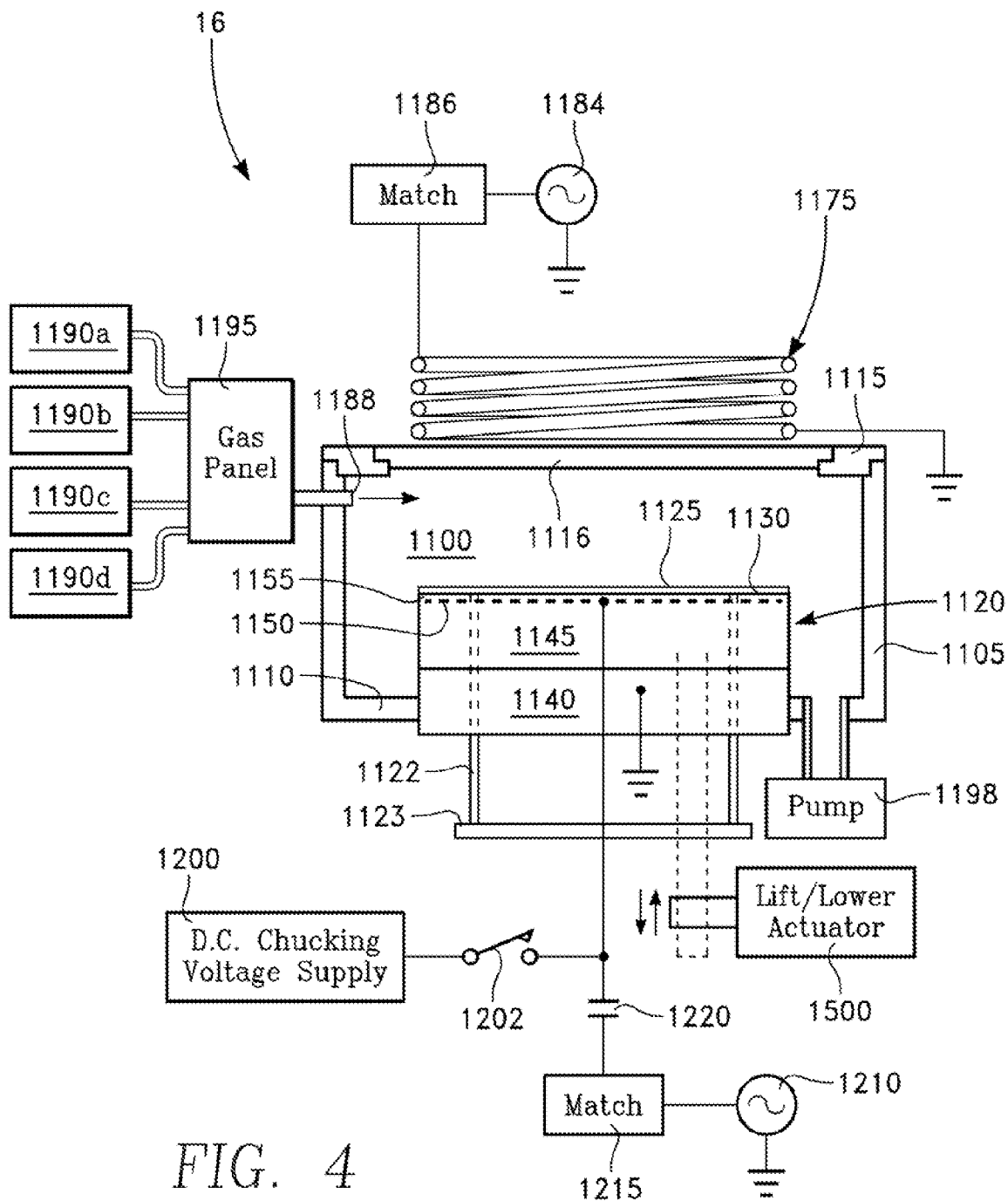
FIG. 4 depicts a first etch reactor in the apparatus of FIG. 3.
Figure 5:
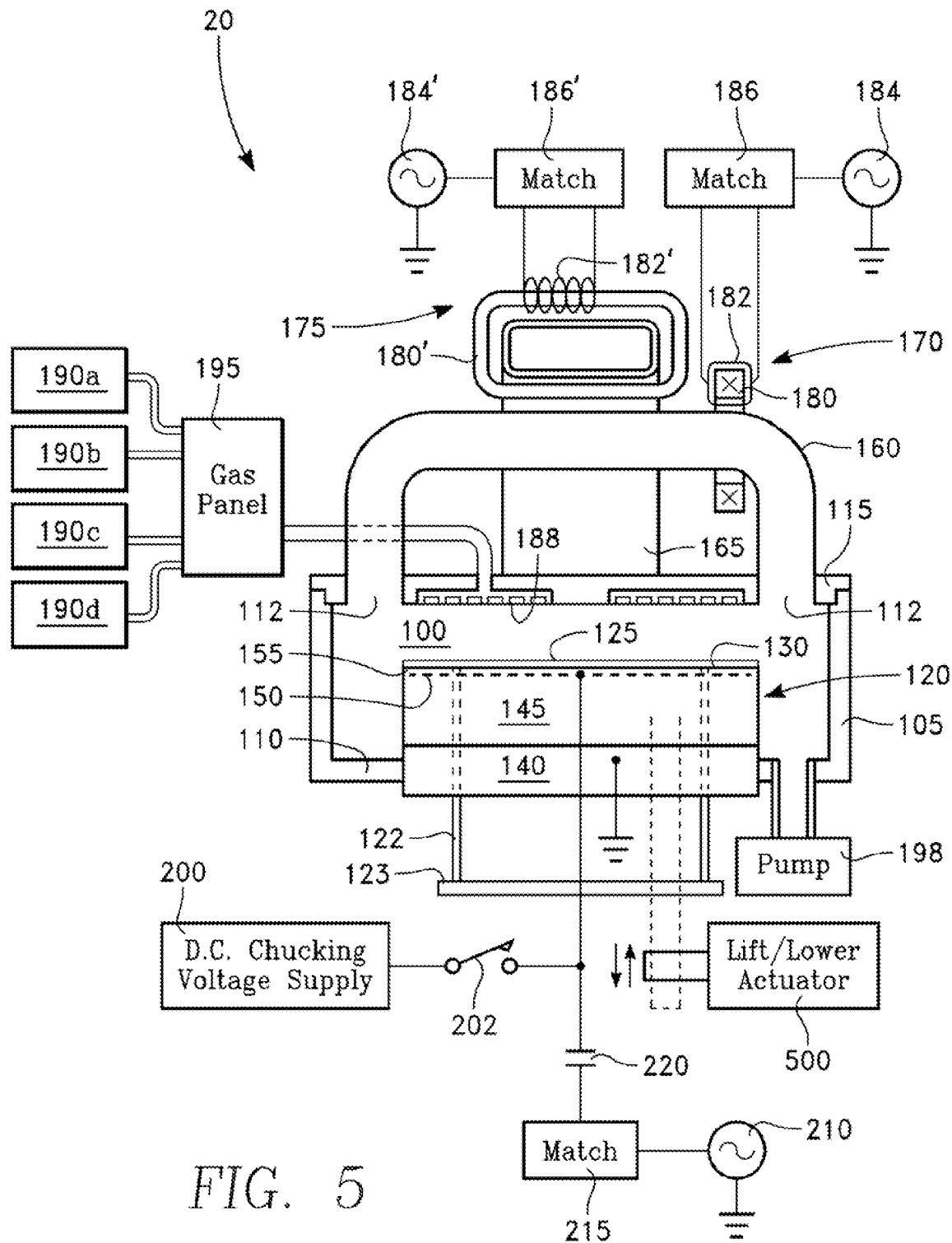
FIG. 5 depicts a second etch reactor in the apparatus of FIG. 3.

FIG. 4 depicts an embodiment of the inductively coupled plasma (TCP) reactor 16 of FIG. 3. The ICP reactor of FIG. 4 has a chamber 1100 enclosed by a cylindrical side wall 1105, a floor 1110 and a ceiling 1115. A wafer support pedestal 1120 within the chamber 1100 may be an electrostatic chuck capable of electrostatically clamping a semiconductor wafer 1125 onto a wafer support surface 1130 of the chuck 1120. The chuck 1120 may consist of a grounded conductive base layer 1140, an insulating layer 1145 overlying the base layer 1140, a thin cathode electrode 1150 overlying the insulating layer 1145, and a top insulating layer 1155 overlying the cathode electrode 1150 and forming the wafer support surface 1130. The material of the insulating layers 1145, 1155 may be a ceramic material. The cathode electrode 1150 may be a thin metallic mesh composed of molybdenum.

In one embodiment, a dielectric window 1116 is in a central portion of the ceiling 1115, and may be formed of silicon dioxide, for example. The ICP reactor of FIG. 4 has an inductively coupled plasma source including an overhead coil antenna 1175 driven by an RF source power generator 1184 through an impedance match 1186. The overhead coil antenna 1175 overlies the dielectric window 1116 and couples RF power into the chamber 1100 through the dielectric window 1116. Reactor performance is sensitive to deposition or accumulation of metal material on the dielectric window 1116 during processing. Such deposition can change or attenuate the coupling of RF power into the chamber interior, which can detract from process control. Such deposition can occur, for example, during exposure or etching of the metal-containing layer 4a of FIG. 1.

Process gas supplies 1190*a*, 1190*b*, 1190*c*, 1190*d* furnish process gas through a user-controllable gas panel 1195 to a gas injection inlet 1188 in the chamber side wall 1105. Alternatively, plural gas injection inlets may be provided. The chamber 1100 is evacuated by a vacuum pump 1198.

The electrostatic chuck 1120 includes a set of elevatable lift pins 1122 supported on a user-controlled lift spider 1123 to enable a robot handler (not shown) to handle the wafer 1125 during placement of the wafer onto the support surface 1130 and removal of the wafer 1125 from the chamber 1100. The lift pins 1122 are typically formed of a ceramic material to avoid contamination during plasma processing. A user-controllable D.C. chucking voltage supply 1200 is connected through a switch 1202 to the mesh electrode 1150. An RF bias power generator 1210 is coupled to the mesh electrode 1150 through an RF impedance match circuit 1215 and through an optional isolation capacitor 1220 (which may be included in the impedance match circuit 1215). The RF bias power generator 1210 may produce RF power at different frequencies including LF, MF, HF and VHF frequencies. For example the RF bias power generator 1210 may produce RF power at 13.56 MHz and at 60 MHz.

In one embodiment, the pedestal 1120 is movable. In this embodiment, the height of the electrostatic chuck 1120 relative to the ceiling 1115 may be adjusted by a pedestal lift actuator 1500 that is mechanically linked to the pedestal 1120. This feature can be used to control or affect plasma ion density distribution or other processing parameters.

FIG. 5 depicts the toroidal source plasma reactor 20 of FIG. 3. The toroidal source plasma reactor of FIG. 5 has a chamber 100 enclosed by a cylindrical side wall 105, a floor 110 and a ceiling 115. In one embodiment, the chamber interior surfaces are all metal, and the reactor performance is at least nearly unchanged by deposition of metallic material in the chamber interior. A wafer support pedestal 120 inside the chamber 100 may be an electrostatic chuck capable of electrostatically clamping a semiconductor wafer 125 onto a wafer support surface 130 of the chuck 120. The chuck 120 may consist of a grounded conductive base layer 140, an insulating layer 145 overlying the base layer 140, a thin cathode electrode 150 overlying the insulating layer 145, and a top insulating layer 155 overlying the cathode electrode 150 and forming the wafer support surface 130. The material of the insulating layers 145, 155 may be a ceramic material. The cathode electrode 150 may be a thin metallic mesh composed of molybdenum.

The reactor of FIG. 5 has a toroidal plasma source including a pair of transverse external reentrant conduits 160, 165 each extending across the diameter of the chamber 100 and coupled at their ends to the interior of the chamber 100 through ports 112 in the ceiling 115. RF power applicators 170, 175 couple RF power into the interior of the reentrant conduits 160, 165 respectively. The RF power applicator 170 consists of a magnetically permeable ring 180 wrapped around the conduit 160, a conductive coil 182 wrapped around a portion of the ring 180 and an RF power generator 184 coupled to the coil 182 through an RF impedance match element 186. The RF power applicator 175 consists of a magnetically permeable ring 180' wrapped around the conduit 165, a conductive coil 182' wrapped around a portion of the ring 180' and an RF power generator 184' coupled to the coil 182' through an RF impedance match element 186'.

The ceiling 115 includes a gas distribution plate 188. Process gas supplies 190*a*, 190*b*, 190*c*, 190*d* furnish process gas through a user-controllable gas panel 195 to the gas distribution plate 188. The chamber 100 is evacuated by a vacuum pump 198. The process gas supplies are capable of furnishing different gas mixtures.

The electrostatic chuck 120 includes a set of elevatable lift pins 122 supported on a user-controlled lift spider 123 to enable a robot handler (not shown) to handle the wafer 125 during placement of the wafer onto the support surface 130 and removal of the wafer 125 from the chamber 100. The lift pins 122 are typically composed of a ceramic material to avoid contamination during plasma processing. A user-controllable D.C. chucking voltage supply 200 is connected through a switch 202 to the mesh electrode 150. An RF bias power generator 210 is coupled to the mesh electrode 150 through an RF impedance match circuit 215 and through an optional isolation capacitor 220 (which may be included in the impedance match circuit 215). The RF bias power generator 210 may produce RF power at different frequencies including LF, MF, HF and VHF frequencies. For example the RF bias power generator 210 may produce RF power at 2 MHz, 13.56 MHz and at 60 MHz.

In one embodiment, the pedestal 120 is movable. In this embodiment, the height of the electrostatic chuck 120 relative to the ceiling 115 may be adjusted by a pedestal lift actuator 500 that is mechanically linked to the pedestal 120. This feature can be used to control or affect plasma distribution or other processing parameters.

In the process of FIG. 2, the first etch process carried out in the ICP reactor of FIG. 4 is halted prior to exposure of the advanced memory material-containing layer 4*a* (FIG. 1), which may be accomplished by halting the process either: (a) before the covering layer 4*b* is etched, or (b) after partial etching of the covering layer 4*b* while leaving a sufficient residual thickness to mask the layer 4*a*. Further in the process of FIG. 2, the second etch process carried out in the toroidal source plasma reactor of FIG. 5 may either; (a) remove only the covering layer 4*b*, or (b) remove both the covering layer 4*b* and a portion of or all of the advanced memory material-containing layer 4*a*. An advantage of the process of FIG. 2 is that the toroidal source plasma reactor 20 of FIG. 5 does not couple RF power through a dielectric window, and is therefore impervious to accumulation of metal on interior chamber surfaces.

While the foregoing is directed to embodiments of the present invention, other and further embodiments of the present invention may be devised without departing from the basic scope thereof, and the scope thereof is determined by the claims that follow.

What is claimed is:

1. A method of etching a stack of thin film layers on a workpiece including a lower thin film, said method comprising first etching said stack in an inductively coupled plasma reactor without exposing said lower thin film layer, and second etching said stack in a toroidal source plasma reactor to expose the lower thin film layer;

wherein stack of thin film layers comprises a covering thin film layer overlying said lower thin film layer, said method further comprising halting said first etching prior to complete removal of said covering thin film layer, so as to leave at least a portion of said covering thin film layer on said lower thin film layer; and wherein said lower thin film layer comprises at least one of: Co, Pt, Pd, Ru, CoPt, CoFe, CoFeB, MgO, PtMn, CoPd, TbFeCo, Fe, FePt, IrMn, NiFe, NiFeCr, CoFeBTa, CoFeBZr, CoFeMnSi, FePd, Cu, IrMnC, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Fe_3Si$, $Fe_2VAl$, $Mn_2VGa$, $Co_2FeGe$.

2. The method of claim 1 wherein said lower thin film layer comprises an advanced memory material.

3. The method of claim 1 wherein said second etching comprises removing said portion of said covering thin film layer.

4. The method of claim 3 wherein said second etching further comprises removing said lower thin film layer.

5. The method of claim 1 wherein said first etching comprises supplying etch process gases into the chamber of said inductively coupled reactor and coupling RF power from an external coil antenna into the chamber of said inductively coupled reactor through a dielectric window.

6. The method of claim 1 wherein said second etching comprises supplying etch process gases into the chamber of said toroidal source plasma reactor and coupling RF power into an external reentrant conduit of said chamber.

7. The method of claim 6 wherein said coupling of RF power into an external reentrant conduit of said chamber comprises coupling RF power to an inductive core surrounding a portion of said external reentrant conduit.

8. A method of etching a workpiece, comprising:
first etching in an inductively coupled plasma reactor a set of overlying thin film layers that overlie a lower thin film layer on said workpiece; and
second etching in a toroidal source plasma reactor a remaining portion of said set of overlying thin film layers to at least expose said lower thin film layer;
wherein said lower thin film layer comprises at least one of: Co, Pt, Pd, Ru, CoPt, CoFe, CoFeB, MgO, PtMn, CoPd, TbFeCo, Fe, FePt, IrMn, NiFe, NiFeCr, CoFeBTa, CoFeBZr, CoFeMnSi, FePd, Cu, IrMnC, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Fe_3Si$, $Fe_2VAl$, $Mn_2VGa$, $Co_2FeGe$.

9. The method of claim 8 wherein said lower thin film layer comprises an advanced memory material.

10. The method of claim 8 further comprising halting said first etching so as to leave said lower thin film layer covered by said remaining portion of said set of overlying thin film layers.

11. The method of claim 10 wherein said second etching comprises removing said remaining portion of said set of overlying thin film layers.

12. The method of claim 11 wherein said second etching further comprises removing said lower thin film layer.

13. The method of claim 8 wherein said first etching comprises supplying etch process gases into the chamber of the inductively coupled reactor and coupling RF power from an external coil antenna into the chamber of the inductively coupled reactor through a dielectric window.

14. The method of claim 8 wherein said second etching comprises supplying etch process gases into the chamber of said toroidal source plasma reactor and coupling RF power into an external reentrant conduit of said chamber.

15. The method of claim 14 wherein said coupling of RF power into an external reentrant conduit of said chamber comprises coupling RF power to an inductive core surrounding a portion of said external reentrant conduit.

16. A method of etching a workpiece, comprising:
first etching in an inductively coupled plasma reactor a set of overlying thin film layers that overlie a lower thin film layer on said workpiece; and
second etching in a toroidal source plasma reactor a remaining portion of said set of overlying thin film layers to at least expose said lower thin film layer;
wherein said lower thin film layer comprises a material selected from the group including: Co, Pt, Pd, Ru, CoPt, CoFe, CoFeB, MgO, PtMn, CoPd, TbFeCo, Fe, FePt, IrMn, NiFe, NiFeCr, CoFeBTa, CoFeBZr, CoFeMnSi, FePd, Cu, IrMnC, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Fe_3Si$, $Fe_2VAl$, $Mn_2VGa$, $Co_2FeGe$.

17. The method of claim 16 wherein said second etching further comprises etching said lower thin film layer.

* * * * *